United States Patent
Tey et al.

(10) Patent No.: US 7,725,095 B2
(45) Date of Patent: May 25, 2010

(54) RF CIRCUIT WITH STACKED PRINTED CIRCUIT BOARDS

(75) Inventors: Tiam Fatt Tey, Singapore (SG); Lye Yoong Lum, Singapore (SG); Feng Lin, Singapore (SG)

(73) Assignee: Thomson Licensing, Boulogne-Billancourt (FR)

( * ) Notice: Subject to any disclaimer, the term of this patent is extended or adjusted under 35 U.S.C. 154(b) by 274 days.

(21) Appl. No.: 10/586,292

(22) PCT Filed: Nov. 4, 2004

(86) PCT No.: PCT/EP2004/012481

§ 371 (c)(1),
(2), (4) Date: Jul. 13, 2006

(87) PCT Pub. No.: WO2005/069709

PCT Pub. Date: Jul. 28, 2005

(65) Prior Publication Data

US 2007/0115359 A1 May 24, 2007

(30) Foreign Application Priority Data

Jan. 14, 2004 (EP) .................................. 04300020

(51) Int. Cl.
*H04B 1/08* (2006.01)
*H04N 5/30* (2006.01)

(52) U.S. Cl. .................. 455/347; 455/293; 455/300; 455/301; 455/333; 455/349; 348/162

(58) Field of Classification Search ............... 455/347, 455/300, 301, 293, 349, 130, 191.1, 189.1, 455/252.1, 253.1, 311–312, 333–334, 90.3, 455/550.1, 575.1; 348/162; 257/686, 777, 257/779, 659, 773, 728, 700, 702, 706, 723–724; 343/702, 772; 327/356, 359, 355, 566
See application file for complete search history.

(56) References Cited

U.S. PATENT DOCUMENTS

| 5,007,841 | A | 4/1991 | Smolley |
| 5,355,532 | A | 10/1994 | Kubo et al. |
| 6,072,992 | A | * | 6/2000 | Mishima et al. ............... 455/76 |
| 6,653,885 | B2 | * | 11/2003 | Wu et al. .................... 327/356 |
| 6,670,926 | B2 | * | 12/2003 | Miyasaka ................... 343/702 |
| 2002/0049042 | A1 | | 4/2002 | Oida et al. |
| 2002/0085126 | A1 | | 7/2002 | Matsumoto et al. |
| 2004/0203528 | A1* | 10/2004 | Ammar et al. ............. 455/90.3 |
| 2005/0124307 | A1* | 6/2005 | Ammar et al. ........... 455/183.2 |
| 2006/0009251 | A1* | 1/2006 | Noda et al. .............. 455/550.1 |
| 2006/0276158 | A1* | 12/2006 | Okabe ........................ 455/333 |
| 2007/0207734 | A1* | 9/2007 | Briere ....................... 455/41.2 |
| 2008/0136559 | A1* | 6/2008 | Takahashi et al. .......... 333/167 |

FOREIGN PATENT DOCUMENTS

| EP | 0431566 | 6/1991 |
| GB | 2274949 A | 1/1998 |
| JP | 61092039 A | 5/1986 |
| JP | 9097993 A | 4/1997 |
| WO | WO 92/03031 | 2/1992 |

OTHER PUBLICATIONS

Search Report Dated Jun. 27, 2005.
JP9097993 Translation Published Apr. 8, 1997.
JP61092039 Translation Published May 10, 1986.

* cited by examiner

*Primary Examiner*—Pablo N Tran
(74) *Attorney, Agent, or Firm*—Robert D. Shedd; Joseph J. Opalach; Brian J. Cromarty

(57) ABSTRACT

An RF unit comprises a tuner, a demodulator and a mixer. At least the tuner and the mixer are disposed on separate first and second substrates. The RF unit further comprises a housing accommodating the first and second substrates. The first substrate and the second substrate are arranged on different levels inside the housing and maintain a predetermined distance between each other.

5 Claims, 5 Drawing Sheets

RF CIRCUIT WITH STACKED PRINTED CIRCUIT BOARDS

This application claims the benefit, under 35 U.S.C. § 365 of International Application PCT/EP04/012481, filed Nov. 4, 2004, which was published in accordance with PCT Article 21(2) on Jul. 28, 2005 in English and which claims the benefit of European patent application No. 04300020.7, filed Jan. 14, 2004.

The present invention is related to an RF circuit. In particular the invention is related to an RF circuit comprising tuner, a demodulator and a mixer, wherein at least the tuner and the mixer or the demodulator are disposed on separate tuner and mixer or demodulator substrates. The unit further comprises a housing accommodating several or all elements of the RF circuit.

The importance of digital networks distributing contents like computer data, video programs, audio programs or the like is strongly increasing. Devices for receiving the digital data are provided with the so-called front end, which is a key-component, e.g. in digital settop boxes or television receivers. The front end is also referred to as network interface module (NIM). Today it can be observed that there is a constant requirement to reduce the size of the NIM, while the number of integrated functions and the number of interfacing pins is increasing.

A common approach to meet these requirements is to miniaturize integrated circuits and other components of the NIM. Miniaturized components, e.g. surface mount devices, or SMD, require special mounting techniques. SMD components are often not suited for conventional wave soldering like through-hole components. The preferred soldering method for SMD components is reflow soldering. If components are placed on both sides of a carrier substrate, a double re-flow soldering process has to be used, which incurs further processing steps. This approach has limitations with regard to design and manufacturing cost because small components normally are more expensive and existing manufacturing equipment may become obsolete and has to be replaced. Further, smaller components have less space between them and unwanted crosstalk and RF interference may increase.

In U.S. Pat. No. 4,353,132 a size reduced double heterodyne tuner is disclosed including a first and a second frequency converter and a bandpass filter. The substrate on which the main pass filter is build is disposed back to back with the substrates in which the first and the second frequency converters are constructed. The grounding conductors of the substrates being in contact with each other serve as shielding plates between the frequency converters and the bandpass filter.

It remains a need for an RF unit with reduced size and without the need to change existing manufacturing equipment.

The invention therefore proposes an RF unit including a tuner, a demodulator and a mixer. The unit may also include an RF switch and RF splitter as well as a first and a second tuner. The first and second tuners may include a main tuner and an out-of-band-tuner (OOB-tuner). The inventive RF unit may further include a remodulator for remodulating decoded RF signals. Selected functional blocks from the group of the above-mentioned functional blocks of the inventive RF unit disposed on separate substrates. For example, the tuner and the mixer or the demodulator may be disposed on separate substrates, and other functional blocks may be disposed together with the tuner and the mixer or the demodulator, as appropriate. The RF unit further includes a housing accommodating the separate substrates.

According to a first embodiment of the invention the tuner substrate and the mixer substrate are arranged on different levels inside the housing and maintain a predetermined distance between each other.

According to a second embodiment of the invention, a first one of the separate substrates is arranged inside the housing, whereas a second one of the substrates is arranged outside of the housing, yet electrically and mechanically connected to each other and the housing. Components on the substrate, which is arranged outside the housing, are connected to components on the substrate inside the housing via one or more connectors, which pass through openings in the housing.

In a preferred embodiment, the connectors are pin strip connectors.

In a further refinement the connectors, which connect the substrates inside and outside of the housing, are used to connect the completed RF unit to a circuit carrier of an electronic appliance.

In yet another embodiment of the inventive RF unit the individual substrates are separated from each other by intermediate shielding material, which may be part of the housing. The connectors may in this case pass through openings in the shield. Advantageously, the components, which are most susceptible to electromagnetic radiation or which are most prone to emit such radiation are arranged inside the housing.

The interior of the shield casing may also be divided into multiple compartments by internal shield walls.

Advantageously, the housing provides shielding against electromagnetic radiation.

In yet a further advantageous embodiment of the invention contacts are arranged linearly along at least two sides of the housing. The contacts may be used to securely fix and connect the RF unit to a circuit carrier substrate while at the same time providing interconnection between individual substrates of the module. Using two or more rows of connecting pins alongside the sides of the housing also provides an improved resistance of the unit against mechanical shock and vibration.

In the drawing an exemplary embodiment of the present invention is shown for illustrative purposes only without limiting the invention. Similar or corresponding elements are denoted with the same reference numbers in the figures of the drawing. In the drawing.

In the drawings, same or similar components are referenced by the same reference numerals.

Throughout the drawings, schematic representations of components are shown with the substrates. These components serve for illustrative purposes only and do not limit the scope of the invention.

Figure 1:
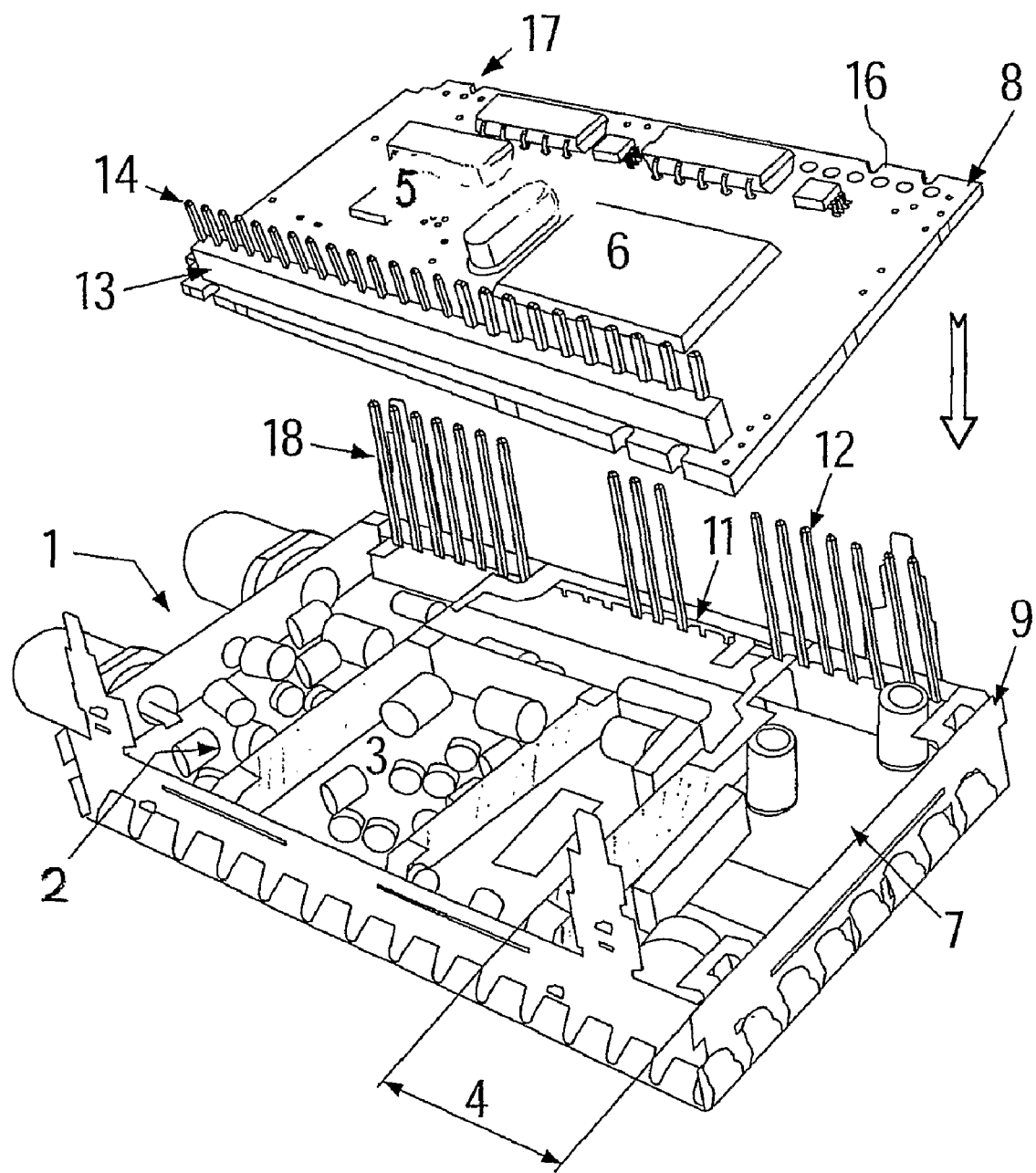
FIG. 1 shows an exploded perspective view of the RF unit according to the present invention.

FIG. 1 shows an exploded perspective view of an embodiment of the RF unit according to the present invention. The RF unit is referenced as a whole with reference number 1. The RF unit 1 includes, on a first substrate 7 an RF switch and an RF splitter or loop-through 2, a first tuner 3 and an IF and analog demodulator 4. A second tuner or a remodulator 5 and a demodulator 6 are arranged on a second substrate 8. The first substrate 7 is mounted in FIG. 1 in the upper portion of a housing 9, preferably made of sheet metal to shield electromagnetic radiation. In FIG. 1, the housing 9 is shown upside down. In a preferred embodiment, the housing 9 is made of one piece of metal, which is cut and bent to form a kind of rectangular tube with one or two open main surfaces. The main surfaces provide access to the interior for mounting the substrates 7 and 8. After assembly of the circuit the open main surfaces are closed by covers not shown in FIG. 1. The covers are preferably made of sheet metal as well as the housing 9. The exemplary housing 9 of FIG. 1 is divided into various shielded compartments. The side walls of the compartments are shown with a diagonal pattern.

To one peripheral side of the first substrate 7 a connector strip 11 is mounted carrying various connection pins 12.

The second substrate 8 is of similar construction, however, carrying a connector strip 13 at the side of the substrate being opposite to the connector strip 11 of the first substrate 7. The connector strip 13 also carries various connection pins 14. In addition, opposed to the connector strip 13 the second substrate 8 is provided with a series of through holes 16. The location of the through holes 16 corresponds to the location of connection pins 12 associated with the first substrate 7. The through holes 16 may or may not be provided with soldering pads depending on the requirement to make electrical contact between the first and second substrates 7 and 8 or to allow the passage of respective connection pins 12 through the second substrate 8. During assembly the first and second substrates 7 and 8 are inserted into the housing 9 and fixed at a predetermined mounting position by brackets, distance holders or the like. These elements are not shown in FIG. 1. Lateral slits 17 in the second substrate 8 are effective as guiding elements in cooperation with corresponding braces 18 of the housing 9 to secure the proper alignment of the through holes 16 with the connection pins 12.

Figure 2:
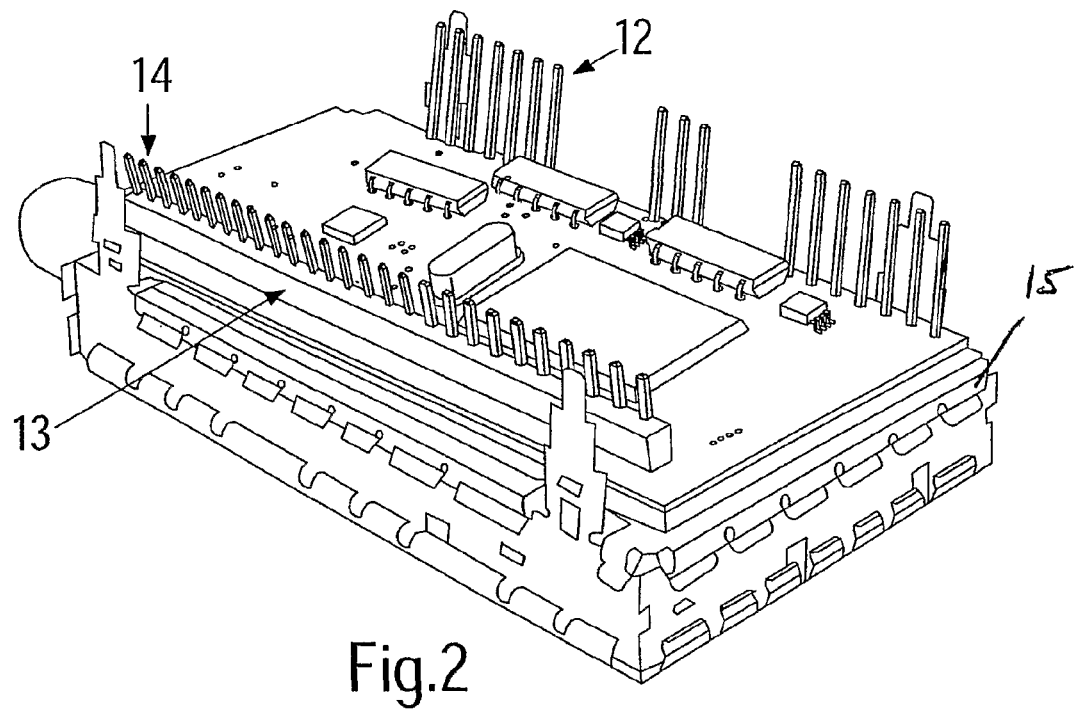
FIG. 2 shows a perspective view of an exemplary embodiment of the assembled RF unit of FIG. 1.

FIG. 2 shows the assembled circuit with first and second substrates 7 and 8 in place. From FIG. 2 it is evident that one group of the connection pins 12 ends at the level of second substrate 8 whereas another group extends beyond the housing 9 as the pins 14 of the connector strip 13 do. The stacked arrangement of the first substrate 7 and the second substrate 8 allows for shorter RF to RF and RF to IF connections between the substrates, reducing radiation and the pick up of interference. The design shown in FIG. 2 having two pin strips 11 and 13 provides many contacts required especially for digital cable NIM. In addition the cross talk between the pins is reduced due to the relative large distance between them whereas at the same time the unit remains very compact. The dual inline arrangement of pins 12 and 14 becomes obvious.

As a further development of the inventive RF unit, in the drawing an intermediate shielding 15 is introduced between the first substrate 7 and the second substrate 8 to further reduce cross talk.

Figure 3A:
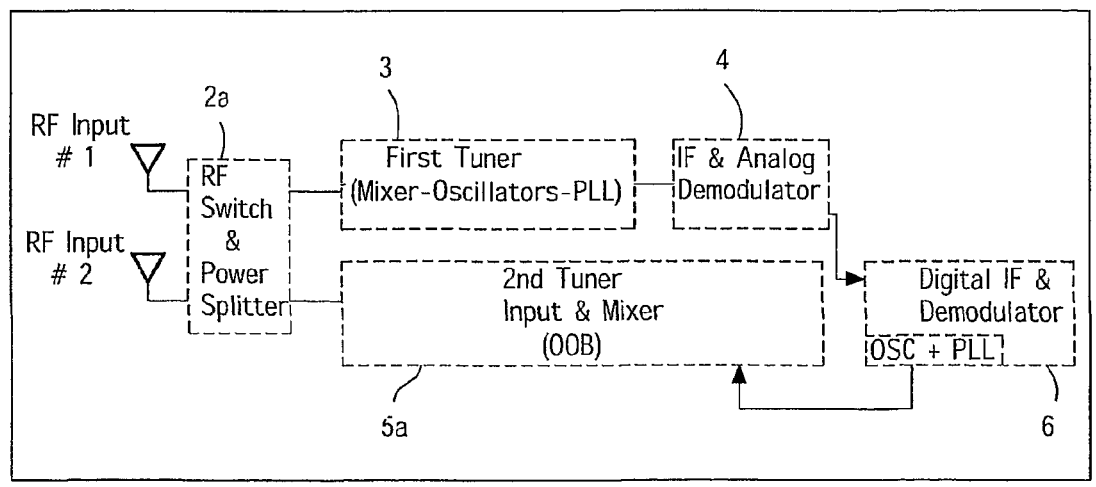
FIG. 3a shows a schematic block diagram of a known RF circuit board including a first and a second tuner.
Figure 3B:
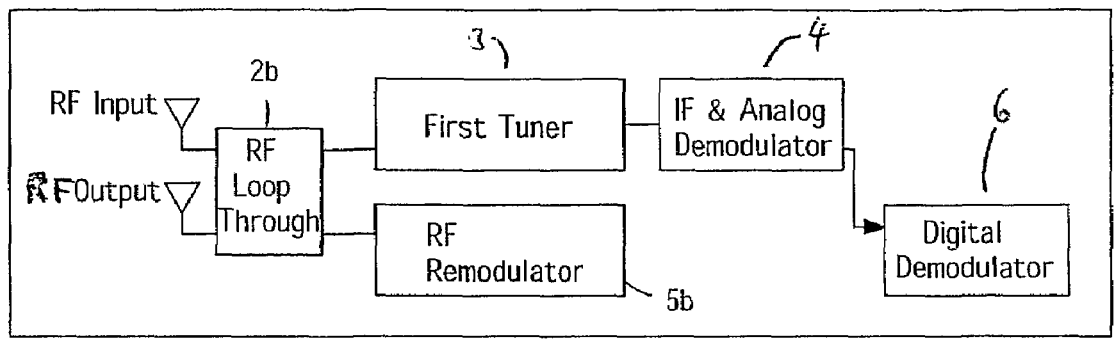
FIG. 3b shows a schematic illustration of a known RF circuit board including a tuner and a remodulator.

FIGS. 3a and 3b schematically show a known network interface module (NIM) design on a single substrate. Due to placing all components in one level, a relatively large sized substrate is required. An RF switch and RF power splitter 2a receives RF signals from a first and a second RF input. A first RF signal from RF switch and RF power splitter 2a is connected to a first tuner 3. The first tuner 3 is connected to an IF and analog demodulation stage 4. The IF and analog demodulation stage 4 is connected to a digital IF and demodulator stage 6. A second RF signal from RF switch and RF power splitter 2a is connected to a second tuner 5a. The second tuner 5a is located close to the RF switch and RF power splitter 2a in order to achieve short RF signal paths. This requires the digital IF and demodulator stage 6 to be located at a certain distance from the RF signal source. Thus, analog and digital signal performance may degrade. Further, distribution of clock signals requires rather long interconnecting wires between the components, thus increasing possible cross talk and interference. In FIG. 3b, the place of the second tuner 5a is occupied by an RF remodulator 5b. However, the situation in terms of space remains the same as in FIG. 3a.

FIG. 4a to 4d illustrate the inventive RF unit in different stages of assembly during production.

Figure 4A:
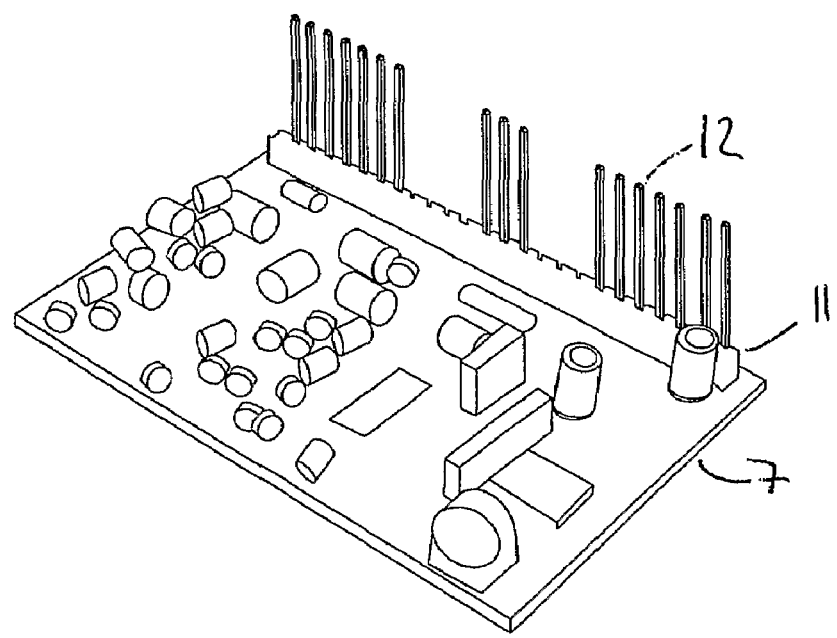
FIG. 4a shows an exemplary embodiment of a first substrate according to the invention.

In FIG. 4a, the first substrate 7 is shown. On the substrate, various components, such as capacitors and inductances, are shown in a schematic representation. The components form functional blocks which are not referenced in detail. Further, a strip 11 of connecting pins 12 is mounted a one outer side of the first substrate 7.

Figure 4B:
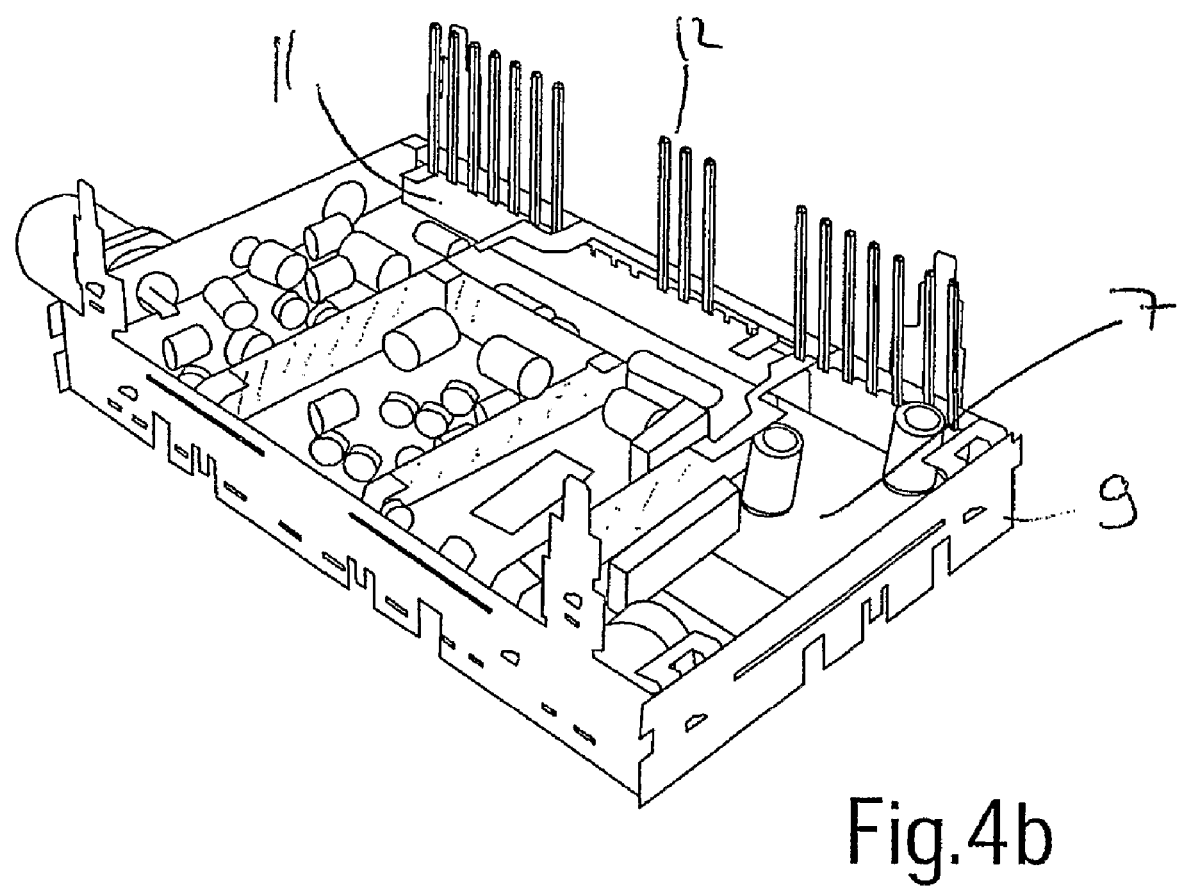
FIG. 4b shows an exemplary embodiment of the first substrate and the housing assembled in a first step.

In FIG. 4b the first substrate 7 is shown mounted in the housing 9. Also shown are a number of shielded compartments within the housing 9. The sidewalls of the compartments are shown with a diagonal pattern.

Figure 4C:
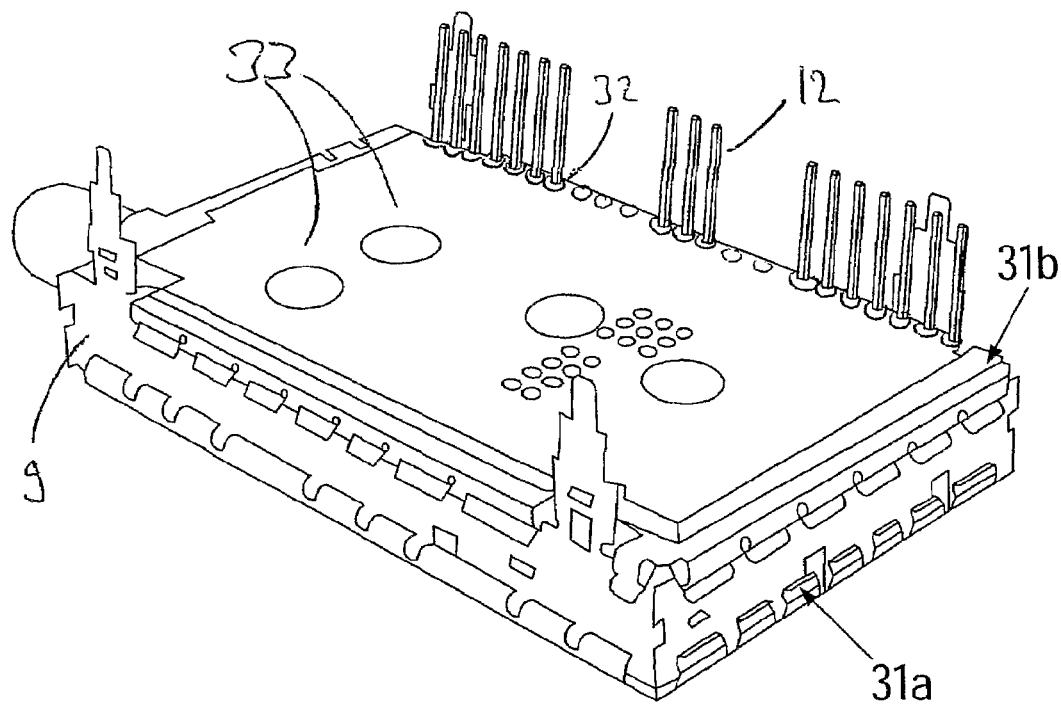
FIG. 4c shows the assembly of FIG. 4b with a shield cover mounted.

In FIG. 4c the housing 9 is shown closed with appropriate covers 31a to 31d. The connector pins 12 of the first substrate 7 project through openings 32. Other openings 33 are provided to allow for accessing the components of the first substrate 7 for adjustment.

Figure 4D:
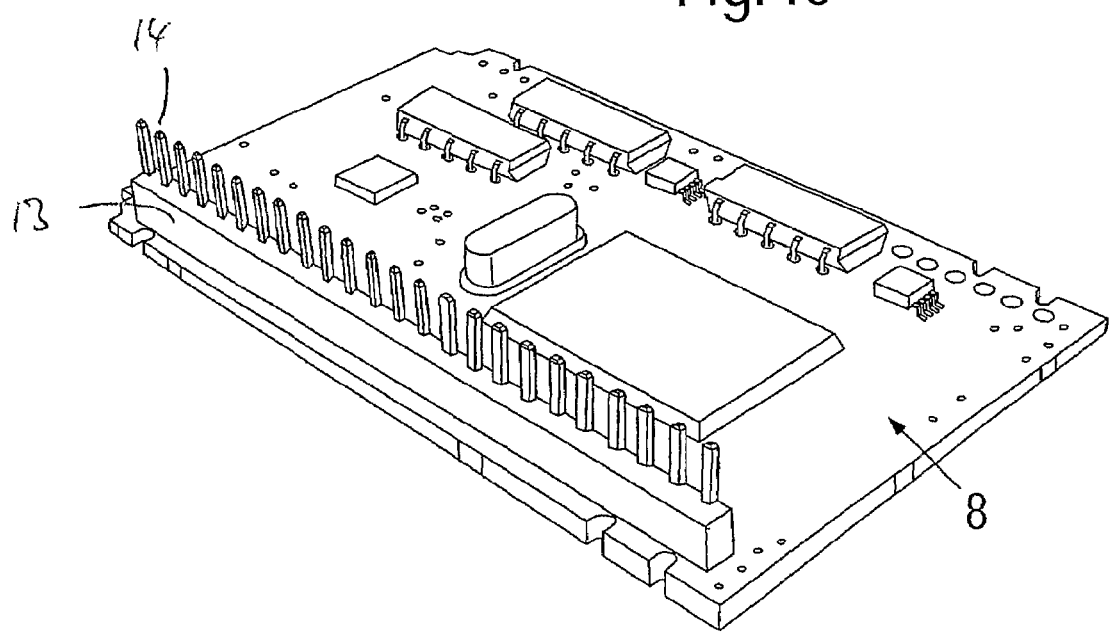
FIG. 4d shows an exemplary embodiment of a second substrate according to the invention.

In FIG. 4d the second substrate 8 is shown, which is subsequently mounted external of the housing 9 such that the cover 31b is effective as an intermediate shielding between the first substrate 7 and the second substrate 8. A connector strip 13 with pins 14 is also shown in FIG. 4d.

The completely assembled RF unit 1 is shown in FIG. 2 and has already been described above. The RF unit 1 may then be mounted to a circuit carrier (not shown) in a single piece.

It is noted that the connector strips shown in the Figures may have different numbers and locations of the pins. The intermediate shield may advantageously have openings 32 along the whole side of the shield. Unused openings remain open. However, due to the small diameter of the openings no detrimental effect to shielding will occur. This allows for using different first and second substrates 7 and 8 without altering the steps of assembly or the housing 9 of the unit. Flexible adaptation to various requirements is thus possible.

It is a particular advantage of the present invention that the size of the unit is very compact compared to the conventional one-dimensional design of RF units. At the same time the invention allows to use existing assembly equipment and thus keeps manufacturing costs low.

The invention is not limited to using two substrates. It is also conceivable to provide more than two substrates, and to arrange a arbitrary number of substrates inside and outside of the housing.

The invention claimed is:

1. An RF unit comprising a tuner, a demodulator and a mixer, wherein the tuner or the tuner and the mixer are arranged on a first substrate and wherein the mixer and the demodulator or the demodulator are arranged on a second substrate, wherein the RF unit further comprises a housing accommodating at least the first substrate, wherein the housing comprises a frame laterally surrounding at least one of the substrates, the frame forming a tubular structure having a length corresponding to the height of the frame and having one or two open main surfaces, wherein the first and second substrates are arranged in parallel on respective different levels, wherein means are provided that maintain a predetermined distance between the first and the second substrate, wherein a connectors is provided that electrically connects the first and the second substrates, wherein the connectors has one or more contacts extending through the first and the second substrate and beyond the height of the frame of the housing and electrically connecting the first or the second substrate of the RF unit to a further circuit carrier, or electrically connecting the first and the second substrate of the RF unit to the further circuit carrier.

2. RF unit according to claim 1, wherein the connectors is provided along at least one side of the respective first and/or second substrate in an essentially linear arrangement.

3. RF unit according to claim 1, wherein the means that maintain the predetermined distance between the first and the second substrate include the connector electrically connecting the first and second substrates.

4. RF unit according to claim 1, wherein the housing is shielding electromagnetic radiation.

5. RF unit according to claim 1, wherein the first and the second substrates are separated by an intermediate shielding.

* * * * *